(12) United States Patent
Jiang et al.

(10) Patent No.: US 6,900,123 B2
(45) Date of Patent: May 31, 2005

(54) BARC ETCH COMPRISING A SELECTIVE ETCH CHEMISTRY AND A HIGH POLYMERIZING GAS FOR CD CONTROL

(75) Inventors: Ping Jiang, Plano, TX (US); Robert Kraft, Plano, TX (US); Mark Somervell, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/393,317

(22) Filed: Mar. 20, 2003

(65) Prior Publication Data

US 2004/0185655 A1 Sep. 23, 2004

(51) Int. Cl.[7] .......................................... H01L 21/4763
(52) U.S. Cl. ........................ 438/636; 438/638; 438/735
(58) Field of Search ................................. 438/622, 636, 438/637, 638, 672, 706, 725, 734, 735

(56) References Cited

U.S. PATENT DOCUMENTS 6,455,411 B1 * 9/2002 Jiang et al. ................. 438/624
6,569,599 B2 * 5/2003 Lee et al. ................. 430/270.1
6,589,707 B2 * 7/2003 Lee et al. ................. 430/270.1

* cited by examiner

Primary Examiner—Kevin M. Picardat
(74) Attorney, Agent, or Firm—Jacqueline J. Garner; W. James Brady, III; Frederick J. Telecky, Jr.

(57) ABSTRACT

A BARC etch comprises a selective etch chemistry in combination with a high-polymerizing gas for CD control. The BARC etch may be used in a via-first dual damascene method. After via (116) pattern and etch, a thick BARC layer (120) is deposited to fill the via (116) and coat the IMD (110). A trench resist pattern (125) is formed over the BARC layer (120). Then, the exposed portion of BARC (120) over the IMD (110) is etched using a high-polymerizing gas added to a selective etch chemistry. The more polymerizing gas passivates the trench resist (125) sidewall to preserve or improve the trench CD. During the main trench etch, portions of BARC (120) remain in the via to protect the etch-stop (104) at the bottom of the via (116).

16 Claims, 3 Drawing Sheets

BARC ETCH COMPRISING A SELECTIVE ETCH CHEMISTRY AND A HIGH POLYMERIZING GAS FOR CD CONTROL

FIELD OF THE INVENTION

The invention is generally related to the field of forming integrated circuits and more specifically to an organic bottom-antireflective coating (BARC) etch that may be used in, for example, a dual damascene process flow for forming interconnect structures.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects and from traditional silicon-dioxide-based dielectrics to low-k dielectrics, such as organo-silicate glass (OSG). Semiconductor fabrication processes that work with copper interconnects and newer low-k dielectrics are still needed. As compared to the traditional subtractive plasma dry etching of aluminum, suitable copper etches for a semiconductor fabrication environment are not readily available. To overcome the copper etch problem, damascene processes have been developed.

In a damascene process, the IMD (intrametal dielectric) is formed first. The IMD is then patterned and etched to form a trench for the interconnect line. If connection vias have not already been formed, a dual damascene process may be used. In a dual damascene process, the trench is formed in the IMD 14 and a via is etched in the (interlevel dielectric) ILD 12 for connection to lower interconnect levels. The barrier layer 16 and a copper seed layer are then deposited over the structure. The barrier layer 16 is typically tantalum nitride or some other binary transition metal nitride. The copper layer is then electrochemically deposited using a seed layer over the entire structure. The copper is then chemically-mechanically polished (CMP'd) to remove the copper over the IMD 14, leaving copper interconnect lines 18 and vias 20 as shown in FIG. 1. A metal etch is thereby avoided.

Patterning and etching in a dual damascene process can be problematic due to the necessity of forming both the trench and the via before filling either with copper. Both trench-first and via-first processes are being developed. In a via-first process, the via is patterned and etched followed by the trench patterning. The bottom of the via needs to be protected during the trench etch to prevent etching of the via etch-stop layer. A dual damascene method that effectively protects the via during the trench etch without creating additional processing problems is desired. Moreover, as new technologies demand ever smaller critical dimensions (CDs) in semiconductor devices, CD control becomes more important. Semiconductor processes must be controllable so that the small CDs can be reproduced.

SUMMARY OF THE INVENTION

The invention is a BARC etch. A spin-on organic BARC is often used to reduce substrate reflectivity during resist pattern. The BARC etch comprises a selective etch chemistry in combination with a high polymerizing gas for CD control. In one embodiment, the BARC etch is used in a via-first dual damascene method. After via pattern and etch, the via is filled with a thick BARC. The trench is patterned and etched. During the trench etch, the exposed BARC layer is etched using a high polymerizing gas (or gases) added to a selective etch chemistry. The high polymerizing gas (or gases) passivates the trench resist sidewall. Thus, the etch may continue until all of the BARC is removed without increasing the critical dimension (CD) and with low dielectric loss.

An advantage of the invention is providing a BARC etch that improves CD control.

This and other advantages will be apparent to those of ordinary skill in the art having reference to the specification in conjunction with the drawings.

DETAILED DESCRIPTION OF THE EMBODIMENTS

Figure 1:
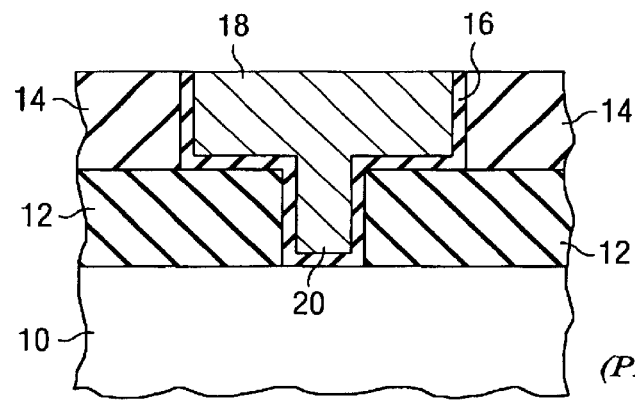
FIG. 1 is a cross-sectional diagram of a conventional dual damascene interconnect structure.

In a via-first dual damascene process, it is desirable to protect the via etch-stop layer during the trench etch. A BARC needed for trench pattern can also be used to fill the via. Due to severe via topography, uniform BARC fill is very difficult. For example, when a thinner BARC fill is used, the vias in a less dense area may be filled while vias in a more dense area are only partially filled. The non-uniformity makes the trench pattern difficult and inconsistent across the via topography.

To improve the trench pattern, a thick BARC fill is used to achieve a full BARC fill even in a dense via region. However, this makes the trench etch more difficult due to the long BARC etch and BARC non-uniformity across the via topography. Depending on the etch chemistry used, this extended etch can increase the trench CD and/or remove too much OSG in the more dense areas due to thinner BARC on the top surface. For example, a $CF_4/O_2/Ar$ BARC etch has a relatively low selectivity to OSG (i.e., ~1:1.5) and results in a significant portion of the OSG being removed in the dense area. On the other hand, a $N_2/O_2$ BARC etch has a high selectivity to OSG (i.e., >20:1) but the extended BARC etch increases the CD on the trench.

To overcome these difficulties, the invention adds a high polymerizing gas or gases (such as $CH_2F_2$, $CH_3F$, $C_4F_6$, $C_4F_8$, $C_5F_8$, etc.) to a highly selective etch chemistry to provide a BARC etch with improved CD control. The degree of selectivity desired depends on the application. For the trench pattern and etch process above, a selectivity of greater than 10:1 is desired. Examples of less-polymerizing gases include $CF_4$, $NF_3$, $C_2F_6$, and $C_XF_{3X+Y}$ (Y>=0). Examples of high-polymerizing gases include $C_4F_8$, $C_5F_8$, $C_4F_6$, $CH_XF_{4-X}$ (X>0). A high-polymerizing gas is one which the C:F ratio is greater than 1:3 (for $C_xF_y$), and the (C+H):F ratio is greater than 1:1 (for $C_xH_yF_z$). The high polymerizing gas provides a passivation mechanism to preserve or even decrease the CD of the etched features. This is accomplished by a passivation layer that is formed on the sidewalls of the resist mask and etched layers. In the case of a dual damascene trench process, the trench resist sidewalls are protected during the long BARC etch and thus the final trench CD is preserved.

In one example, the preferred embodiment adds a high-polymerizing gas ($CH_2F_2$) to a $N_2/O_2$ chemistry. An $N_2/O_2$ chemistry provides high selectivity between a BARC layer and OSG. An exemplary process is given below:

| | |
|---|---|
| Pressure: | 15 mTorr |
| Power: | 200 Watt |
| $CH_2F_2$ flow: | 20 sccm |
| $N_2$ flow: | 80 sccm |
| $O_2$ flow: | 20 sccm |
| Chuck temp.: | 20° C. |

The above process results in a BARC etch rate of ~2200 Å/min and an OSG etch rate of ~11 Å/min. The trench etch CD bias for a 2400 Å BARC is ~−15 nm compared to a CD bias of ~+30 nm without the $CH_2F_2$ addition. Accordingly, both good CD control and a very selective etch rate are achieved.

A preferred embodiment of the invention will now be described in conjunction with a via-first dual damascene process using an organo-silicate glass (OSG) as the dielectric. It will be apparent to those of ordinary skill in the art that the invention may be applied to other BARC etch processes to control CD, such as FSG (fluorine-doped silicate glass) dual damascene trench etch, via or contact hole etch as well as other dual damascene or single damascene etches. For example, in a dual damascene process with bilayer or trilayer resists where the pattern is in the top layer of resist, the invention may be applied to etch the bottom layer of the bilayer resist or the middle and bottom layers of a trilayer resist to preserve CDs.

Figure 2A:
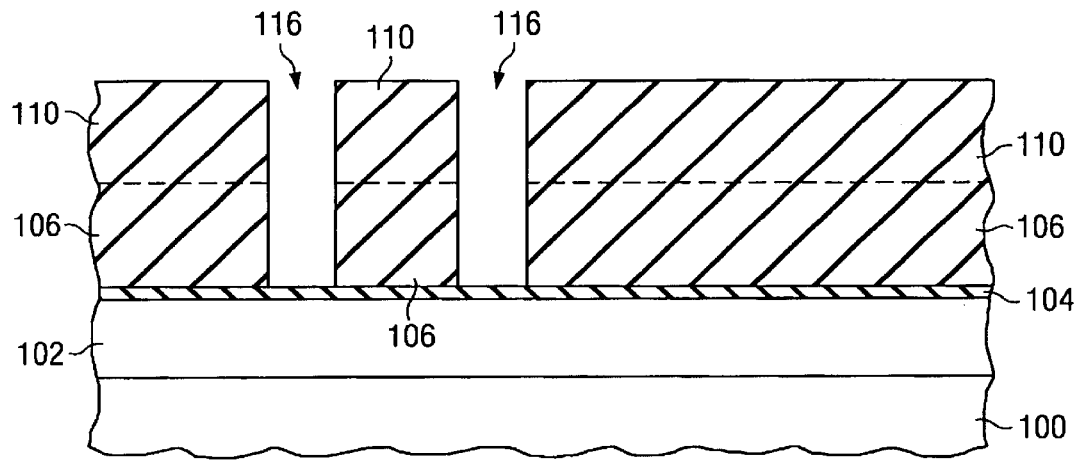
FIGS. 2A–2E are cross-sectional diagrams of a via-first dual damascene interconnect according to the invention at various stages of fabrication.

Referring to FIG. 2A, a semiconductor body 100 is processed through the formation of a first interconnect level 102. First interconnect level 102 may in fact be Metal 1 or it may be any metal interconnect level other than the upper most interconnect layer. An etch-stop layer 104 is formed over first interconnect level 102. In the preferred embodiment etch-stop layer 104 comprises silicon nitride. Alternative materials for etch-stop layer 104, such as SiC, are known in the art.

An ILD layer 106 is deposited over etch-stop layer 104. An IMD 110 is deposited over the ILD layer 106. If desired, an etch-stop layer may be formed between ILD 106 and IMD 110. This etch-stop layer may also comprise silicon nitride. ILD 106 and IMD 110 comprise OSG in the preferred embodiment. Alternative dielectric materials, such as FSG, are known in the art.

Still referring to FIG. 2A, vias 116 are etched in IMD 110 and ILD 106. A resist mask (not shown) is typically used to pattern and etch vias. A hardmask may be optionally deposited on the top of the IMD layer. Appropriate etch chemistries are known in the art. For example, in the case of OSG, the etch of IMD 110 and ILD 106 may comprise $C_4F_8/N_2/Ar$. The etch chemistry will of course depend on the dielectric (106/110), etch-stop, and hardmask materials used.

Figure 2B:
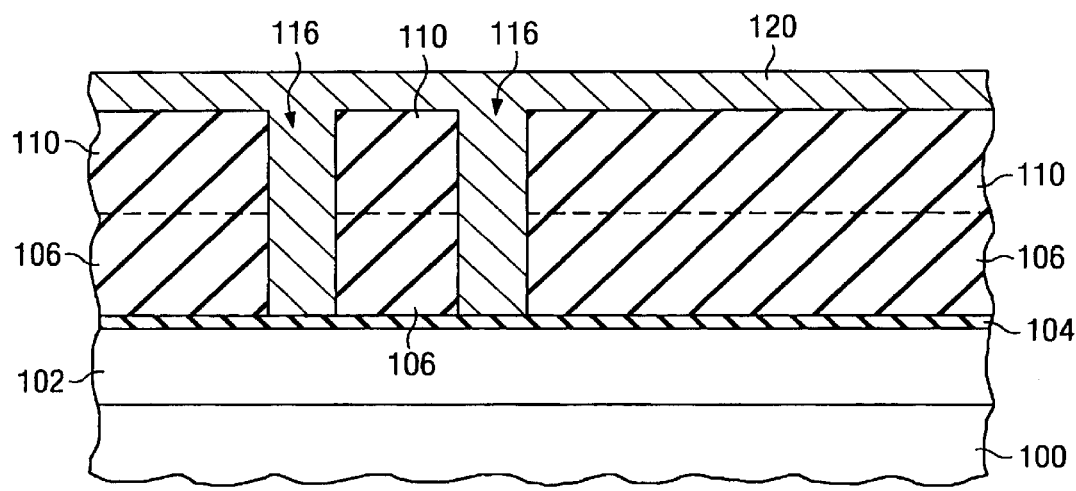

Referring to FIG. 2B, a BARC layer 120 is deposited to fill vias 116. Preferably, a single thick BARC layer is deposited to form layer 120. The thickness of the BARC layer 120 is highly dependent upon the via CD, via depth, and via density. For example, a BARC thickness in the range of 2400 Å may be needed to achieve a complete via fill across the via topography.

Figure 2C:
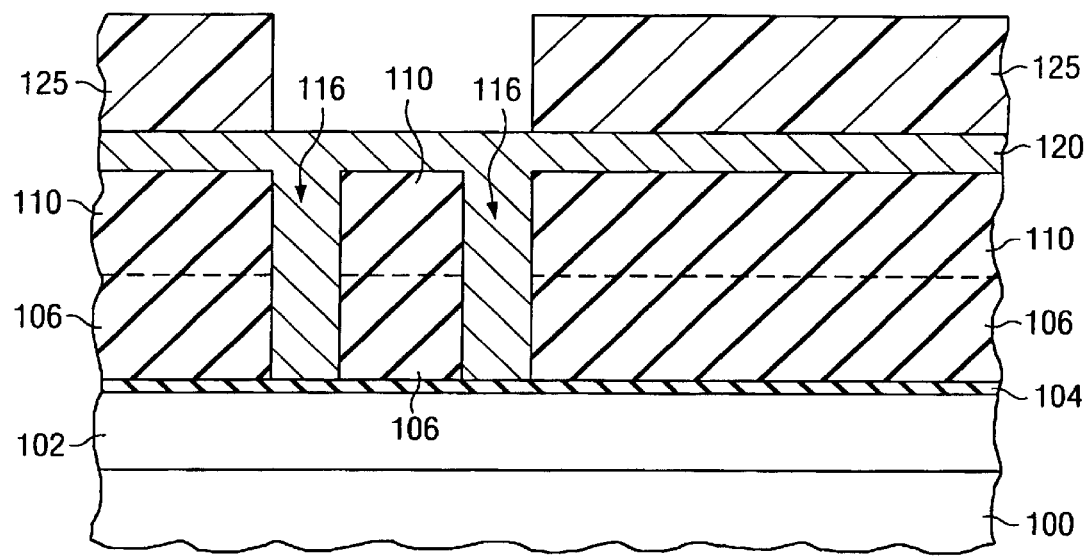

Referring to FIG. 2C, a trench pattern 125 is formed on the BARC layer 120. Various methods are being developed for patterning the trenches and vias in a dual damascene process. For example, the trench pattern 125 may be formed after BARC fill and include both a resist mask and a hardmask.

Figure 2D:
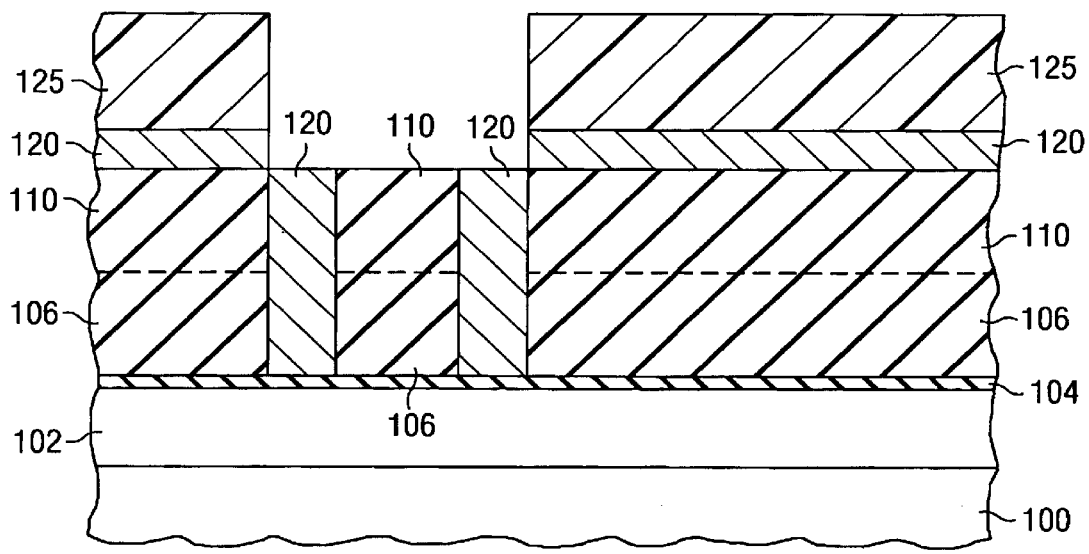

Referring to FIG. 2D, the exposed BARC layer 120 is removed during a BARC etch portion of the trench etch. A highly selective BARC to IMD 110 etch chemistry is used in conjunction with a high-polymerizing gas. The high-polymerizing gas may, for example, comprise $CH_2F_2$, $CH_3F$, $C_4F_6$, $C_4F_8$, or $C_5F_8$. The presence of the high-polymerizing gas passivates the sidewalls of the trench pattern 125. The passivation layer preserves the CD of the trench pattern 125 during the long BARC etch. In the case of OSG (for IMD 110 and ILD 106), the following BARC etch chemistry may be used:

| | |
|---|---|
| Pressure: | 15 mTorr |
| Power: | 200 Watt |
| $CH_2F_2$ flow: | 20 sccm |
| $N_2$ flow: | 80 sccm |
| $O_2$ flow: | 20 sccm |
| Chuck temp.: | 20° C. |

Figure 2E:
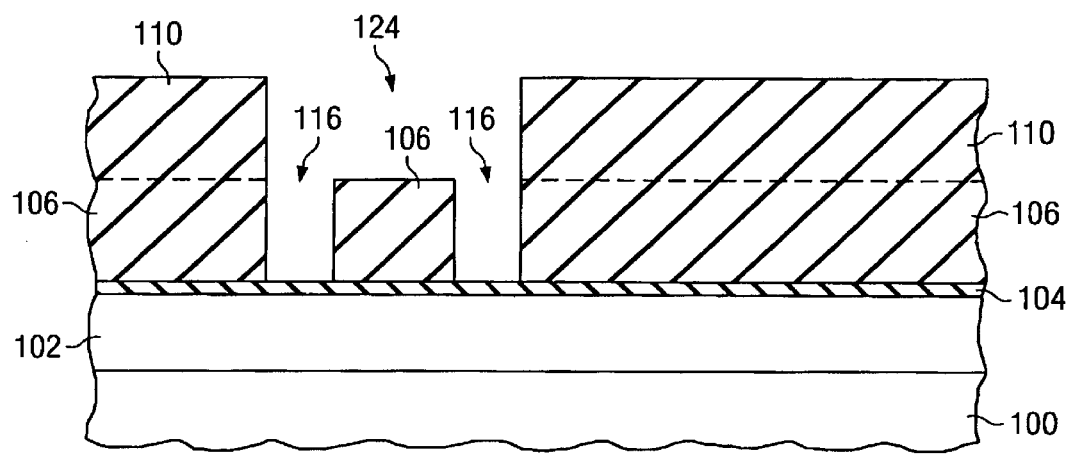

The BARC etch continues until the BARC layer 120 is cleared over exposed portions of IMD 110, as shown in FIG. 2D. After the BARC etch, portions of BARC layer 120 remain in the vias to protect the etch-stop layer 104 during the main trench etch. The main trench etch is then performed to remove the exposed portions of IMD 110. Appropriate etch chemistries are known in the art. For example, in the case of OSG, the etch chemistry may comprise $C_4F_8/N_2/Ar$. After the main trench etch, the trench resist pattern 125 and any remaining portions of BARC layer 120 are removed as shown in FIG. 2E.

Figure 2F:
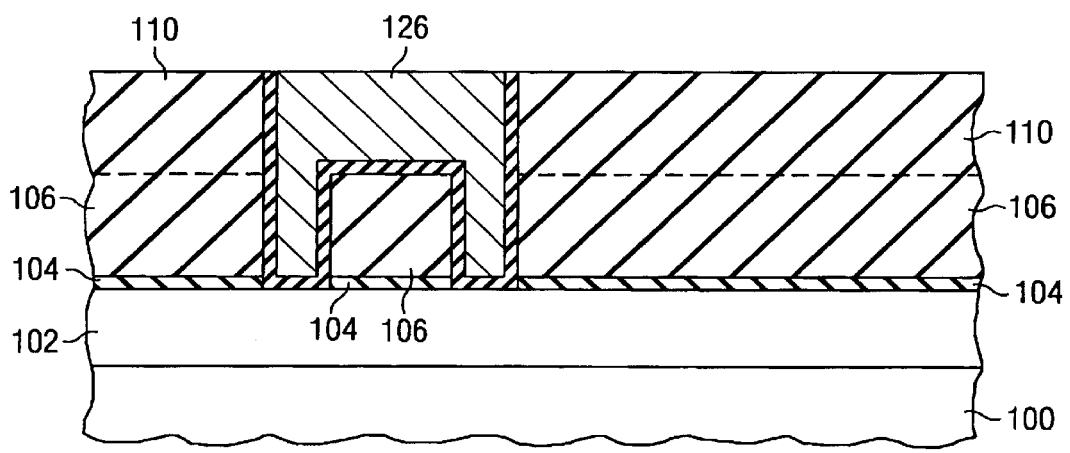

Next, the via 116 is opened by etching the remaining portion of etchstop layer 104 at the bottom of via 116. Then, the desired barrier layers and copper fill are formed and CMP'd back to form second interconnect layer 126, as shown in FIG. 2F. For example, a TaN barrier may be deposited in trench 124 and via 116 followed by a copper seed layer. Using an electroplating process, the copper fill layer is formed. Then, the copper is chemically-mechanically polished until it is relatively planar with the top of IMD 110. The above process may then be repeated to form additional metal interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:

providing a semiconductor body having a patternable layer;

depositing a BARC layer over said patternable layer;

forming a resist mask over said BARC layer, said resist mask exposing a portion of said BARC layer; and etching the exposed portion of said BARC layer over said patternable layer using a selective etch chemistry in combination with a high-polymerizing gas to passivate sidewalls of said resist mask, wherein said selective etch chemistry selectively etches said BARC layer with respect to said patternable layer.

2. The method of claim 1, wherein said patternable layer comprises a dielectric and further comprising the step of etching a trench in said dielectric using said resist mask after said step of etching the exposed portion of said BARC layer.

3. The method of claim 1, wherein said patternable layer comprises a dielectric and further comprising the step of etching a via hole in said dielectric using said resist mask after said step of etching the exposed portion of said BARC layer.

4. The method of claim 1, wherein said patternable layer comprises a dielectric and further comprising the step of etching a contact hole in said dielectric using said resist mask after said step of etching the exposed portion of said BARC layer.

5. The method of claim 1, wherein said high-polymerizing gas is selected from the group consisting of $CH_2F_2$, $CH_3F$, $C_4F_6$, $C_4F_8$, and $C_5F_8$.

6. A method for fabricating an integrated circuit, comprising the steps of:
   providing a semiconductor body having a dielectric layer formed thereover;
   depositing a BARC layer over said dielectric layer;
   patterning a resist mask on said BARC layer, said resist mask exposing a portion of said BARC layer;
   etching the exposed portion of said BARC layer using a selective etch chemistry and a high-polymerizing gas without increasing a pattern CD of the resist mask, wherein said selective etch chemistry is selective against etching said dielectric layer; and
   etching a cavity in said dielectric layer.

7. The method of claim 6, wherein said dielectric layer comprises OSG.

8. The method of claim 7, wherein said selective etch chemistry comprises $N_2$ and $O_2$.

9. The method of claim 6, wherein said more polymerizing gas is selected from the group consisting of $CH_2F_2$, $CH_3F$, $C_4F_6$, $C_4F_8$, and $C_5F_8$.

10. The method of claim 6, wherein said cavity comprises a trench.

11. The method of claim 6, wherein said cavity comprises a contact.

12. The method of claim 6, wherein said cavity comprises a via.

13. A method for fabricating an integrated circuit, comprising the steps of:
   providing a semiconductor body having a first and a second dielectric layer formed thereover;
   etching a via through said first and said second dielectric layers;
   depositing a BARC layer to fill said via and coat a surface of said second dielectric layer;
   forming a resist mask on said BARC layer, said resist mask exposing a portion of said BARC layer;
   etching the exposed portion of said BARC layer over said second dielectric layer using a selective etch chemistry and a high-polymerizing gas without increasing a CD of said resist mask, wherein a portion of said BARC layer remains in said via, said selective etch chemistry being a selective BARC to dielectric etch chemistry;
   etching said second dielectric layer using said resist mask to form a trench; and
   removing said resist mask and any remaining portions of said BARC layer.

14. The method of claim 13, wherein said high-polymerizing gas is selected from the group consisting of $CH_2F_2$, $CH_3F$, $C_4F_6$, $C_4F_8$, and $C_5F_8$.

15. The method of claim 13, wherein said first and second dielectric layers comprise OSG.

16. The method of claim 15, wherein said selective etch chemistry comprises $N_2/O_2$.

* * * * *